US012727344B2

(12) United States Patent
Lin et al.

(10) Patent No.: US 12,727,344 B2
(45) Date of Patent: Sep. 1, 2026

(54) MICRO DISPLAY DEVICE

(71) Applicant: UNITED MICROELECTRONICS CORP., Hsin-Chu City (TW)

(72) Inventors: Chuan-Lan Lin, Chiayi City (TW); Yu-Ping Wang, Hsinchu City (TW); Chien-Ting Lin, Tainan City (TW); Chu-Fu Lin, Kaohsiung City (TW); Chun-Ting Yeh, Taipei City (TW); Chung-Hsing Kuo, Taipei City (TW); Yi-Feng Hsu, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 345 days.

(21) Appl. No.: 18/135,741

(22) Filed: Apr. 18, 2023

(65) Prior Publication Data

US 2024/0315095 A1 Sep. 19, 2024

(30) Foreign Application Priority Data

Mar. 17, 2023 (TW) ................................ 112110009

(51) Int. Cl.
*H10K 59/131* (2023.01)

(52) U.S. Cl.
CPC .................................. *H10K 59/131* (2023.02)

(58) Field of Classification Search
CPC ......... H01L 24/05; H01L 24/06; H01L 24/08; H01L 24/09; H01L 24/25; H10K 59/131
See application file for complete search history.

(56) References Cited

U.S. PATENT DOCUMENTS

| | | | | |
|---|---|---|---|---|
| 9,190,391 | B2 | 11/2015 | Kelkar et al. | |
| 10,312,201 | B1 | 6/2019 | Hu et al. | |
| 10,818,624 | B2 * | 10/2020 | Chen | H01L 24/08 |
| 2010/0148221 | A1 | 6/2010 | Yu | |
| 2017/0301650 | A1 | 10/2017 | Yu | |
| 2019/0123006 | A1 * | 4/2019 | Chen | H01L 24/08 |
| 2019/0287932 | A1 * | 9/2019 | Hu | H01L 24/08 |
| 2020/0058622 | A1 | 2/2020 | Chen | |
| 2020/0395339 | A1 * | 12/2020 | Chen | H01L 24/80 |
| 2021/0202418 | A1 * | 7/2021 | Lin | H01L 25/50 |
| 2022/0359440 | A1 * | 11/2022 | Chen | H01L 23/5283 |
| 2022/0384376 | A1 * | 12/2022 | Lin | H01L 24/09 |

FOREIGN PATENT DOCUMENTS

| | | |
|---|---|---|
| TW | 201332073 A | 8/2013 |
| TW | 201926408 A | 7/2019 |

* cited by examiner

*Primary Examiner* — Steven M Page
(74) *Attorney, Agent, or Firm* — Winston Hsu

(57) ABSTRACT

A semiconductor device includes a substrate having a bonding area and a pad area, a first inter-metal dielectric (IMD) layer on the substrate, a metal interconnection in the first IMD layer, a first pad on the bonding area and connected to the metal interconnection, and a second pad on the pad area and connected to the metal interconnection. Preferably, the first pad includes a first portion connecting the metal interconnection and a second portion on the first portion, and the second pad includes a third portion connecting the metal interconnection and a fourth portion on the third portion, in which top surfaces of the second portion and the fourth portion are coplanar.

17 Claims, 6 Drawing Sheets

MICRO DISPLAY DEVICE

BACKGROUND OF THE INVENTION

1. Field of the Invention

The invention relates to a semiconductor device, and more particularly, to a micro display device fabricated by using 3DIC approach.

2. Description of the Prior Art

As technology advances, augmented reality (AR) and virtual reality (VR) applications also progresses rapidly and in a foreseen future, AR and VR applications will likely be applicable to our daily lives including various applications in the fields of education, logistics, medicine, and military.

Currently, AR and VR applications are commonly implemented by head-mounted displays. The head-mounted displays in most circumstances connect the display driver integrated circuits (DDICs) including high-voltage (HV) devices, medium-voltage (MV) devices, and/or low-voltage (LV) devices to a display module through extremely long wires or metal interconnections. This design is typically applied to larger scale products that not only consumes a great amount of space but also increases the difficulty for mounting the device. Hence, how to improve the current process for producing a display device suitable for both AR and VR environments has become an important task in this field.

SUMMARY OF THE INVENTION

According to an embodiment of the present invention, a semiconductor device includes a substrate having a bonding area and a pad area, a first inter-metal dielectric (IMD) layer on the substrate, a metal interconnection in the first IMD layer, a first pad on the bonding area and connected to the metal interconnection, and a second pad on the pad area and connected to the metal interconnection. Preferably, the first pad includes a first portion connecting the metal interconnection and a second portion on the first portion, and the second pad includes a third portion connecting the metal interconnection and a fourth portion on the third portion, in which top surfaces of the second portion and the fourth portion are coplanar.

According to another aspect of the present invention, a semiconductor device includes a circuit area defined on a substrate, a bonding area around the circuit area, a pad area around the bonding area, and a first pad and a second pad on the bonding area. Preferably, the first pad and the second pad have different shapes in a top view.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
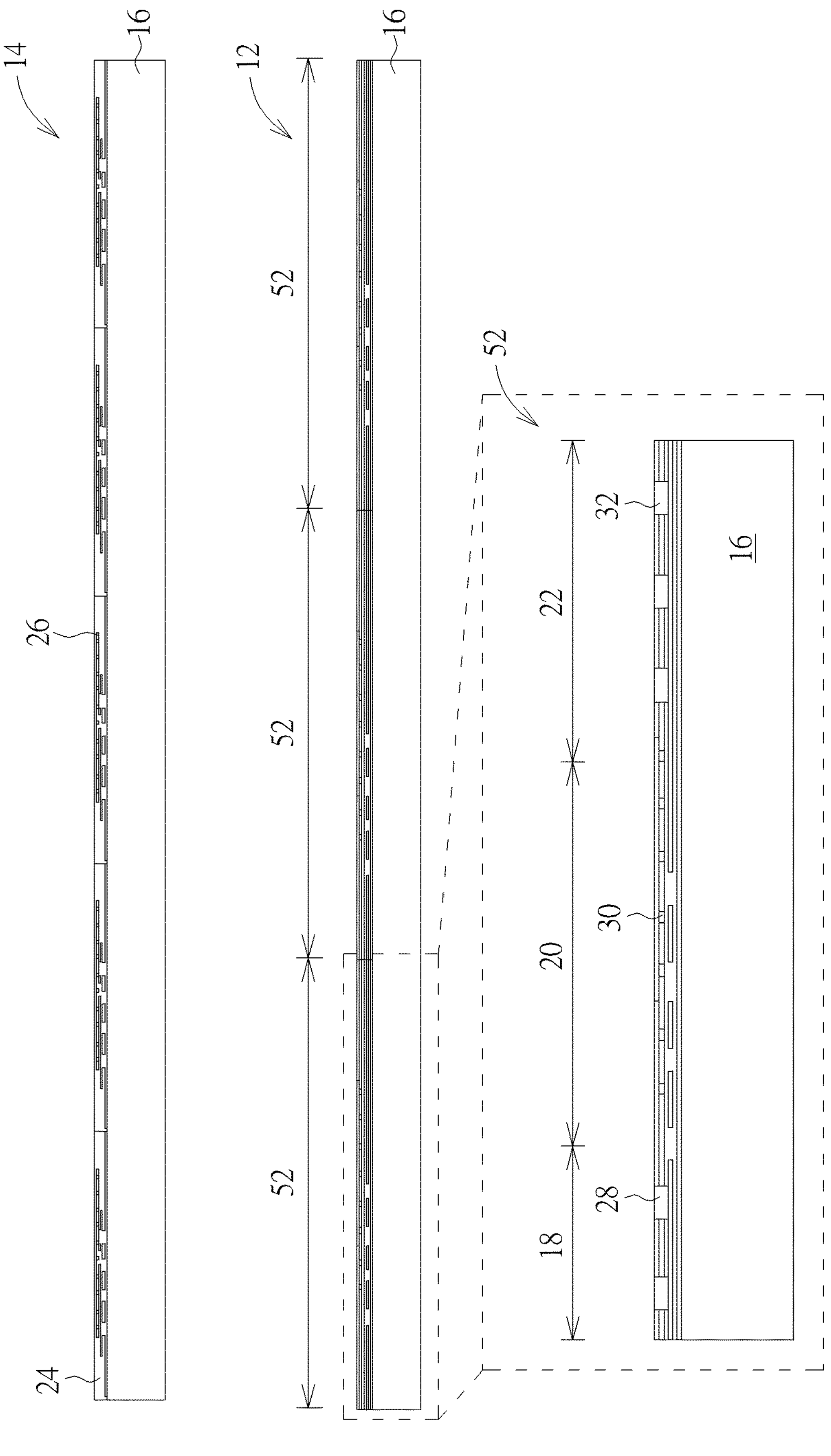
FIGS. 1-5 illustrate a method for fabricating a micro display device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Referring to FIGS. 1-5, FIGS. 1-5 illustrate a method for fabricating a micro display device according to an embodiment of the present invention. As shown in FIG. 1, a wafer 12 and a wafer 14 both made of semiconductor material is provided, in which the wafer 12 includes MV devices, HV devices, and pixel circuits thereon while the wafer 14 includes LV devices for LV driving circuits and/or graphics process unit (GPU) thereon. Preferably, each of the wafers 12, 14 include a substrate 16 made of semiconductor materials as the substrate 16 could also be made of semiconductor substrate material including but not limited to for example silicon substrate, epitaxial silicon substrate, silicon carbide substrate or even a silicon-on-insulator (SOI) substrate, which are all within the scope of the present invention.

It should be noted that since the wafer 12 is typically used for supporting or connecting part of the LV devices and display modules after the wafer 14 is diced, hence a plurality of die regions 52 could be first defined on the wafer 12 so that after the other chips are bonded onto the wafer 12, the wafer 12 could then be diced according to each of the die regions 52. Preferably, the area or size of each of the die regions 52 is substantially greater than the size of the chip bonded afterwards and three regions including a first area 18, a second area 20, and a third area 22 are further defined on each of the die regions 52. Preferably, the first area 18 includes a bonding area used for connecting to external circuits, the second area 20 includes a chip to wafer area used for bonding to chips or dies obtained from dicing the wafer 14, and the third area 22 includes a micro-display area used for connecting to a micro display module.

In this embodiment, active devices and/or passive devices could be disposed on the wafers 12, 14, in which the active device could include metal-oxide semiconductor (MOS) transistor, oxide semiconductor field effect transistor (OS FET), fin field effect transistor (FinFET), or other active devices. If a MOS transistor were to be fabricated, the MOS transistor could include elements such as a gate structure on the substrate 16, a spacer (not shown) adjacent to the sidewalls of the gate structure, and a source/drain region in the substrate adjacent to two sides of the spacer, an interlayer dielectric (ILD) layer or inter-metal dielectric (IMD) layer 24 disposed on each of the MOS transistors, and metal interconnections 26 disposed in the ILD layer or IMD layer for connecting to each of the MOS transistors. Preferably, the devices or elements disposed on the wafer 12 are fabricated through a 65-80 nm technology node while the devices or elements disposed on the wafer 14 are fabricated through a 28-40 nm technology node.

At this stage or before other diced chips are bonded onto the wafer 12, a plurality of bonding pads 28, 30, 32 are disposed on each of the first area 18, the second area 20, and the third area 22 of the wafer 12 for connecting to the aforementioned active or passive devices. For achieving optimal connection with other devices in the later process, the bonding pads 28, 30, 32 disposed on the first area 18, the second area 20, and the third area 22 and the target elements connected to the bonding pads 28, 30, 32 afterwards could be made of same material or different materials while the bonding pads 28, 30, 32 themselves on the first area 18, the second area 20, and the third area 22 could also be made of same material or different materials.

For instance, the bonding pads 28 disposed on the first area 18 and the bonding pads 30 disposed on the second area 20 could be made of same material or different materials, the bonding pads 28 disposed on the first area 18 and the bonding pads 32 disposed on the third area 22 could be made of same material or different materials, and the bonding pads 30 disposed on the second area 20 and the bonding pads 32 disposed on the third area 22 could be made of same material or different materials. In this embodiment, since the bonding pads 28 disposed on the first area 18 are preferably used for connecting to external circuits, the bonding pads 28 are preferably made of low resistance material including but not limited to for example gold (Au). Moreover, the bonding pads 30 disposed on the second area 20 are preferably made of copper (Cu) and the bonding pads 32 disposed on the third area 22 preferably used for connecting to solder balls or bumps from a micro display module are preferably made of Cu or Al. It should be noted that in contrast to a plurality of bonding pads 28, 30, 32 have already been disposed on the first area 18, the second area 20, and the third area 22 of the wafer 12, no bonding pads are disposed on the wafer 14 at this stage except the aforementioned active devices and metal interconnections 26 connecting to the active devices.

In addition, the bonding pads 28, 30, 32 disposed on the first area 18, the second area 20, and the third area 22 also have different pitches, gaps, or spacing therebetween. For instance, the pitch or spacing between the bonding pads 28 on the first area 18 is preferably greater than the pitch or spacing between the bonding pads 30 on the second area 20 and the pitch or spacing between the bonding pads 28 on the first area 18 is also greater than the pitch or spacing between the bonding pads 32 on the third area 22. The pitch or spacing between the bonding pads 30 on the second area 20 on the other hand could be equal to or slightly less than the pitch or spacing between the bonding pads 32 on the third region 22. In this embodiment, the pitch or spacing between the bonding pads 28 on the first area 18 is preferably between 20-200 microns (μm), the pitch or spacing between the bonding pads 30 on the second area 20 is between 1-20 microns, and the pitch or spacing between the bonding pads 32 on the third area 22 is between 2-20 microns.

It should further be noted that the pitch or spacing between the bonding pads 28, 30, 32 on each area preferably refers to that all of the pitches or spacing between the bonding pads 28, 30, 32 on a certain area being less than or greater than the pitches or spacing between the bonding pads 28, 30, 32 on another area. For instance, the statement of the pitch or spacing between bonding pads 28 on the first area 18 being greater than the pitch or spacing between bonding pads 30 on the second area 20 and the pitch or spacing between bonding pads 32 on the third area 22 typically refers to that all of the pitches or spacing between bonding pads 28 on the first area 18 are greater than all of the pitches or spacing between bonding pads 30 on the second area 20 and all of the pitches or spacing between bonding pads 32 on the third area 22.

Figure 2:
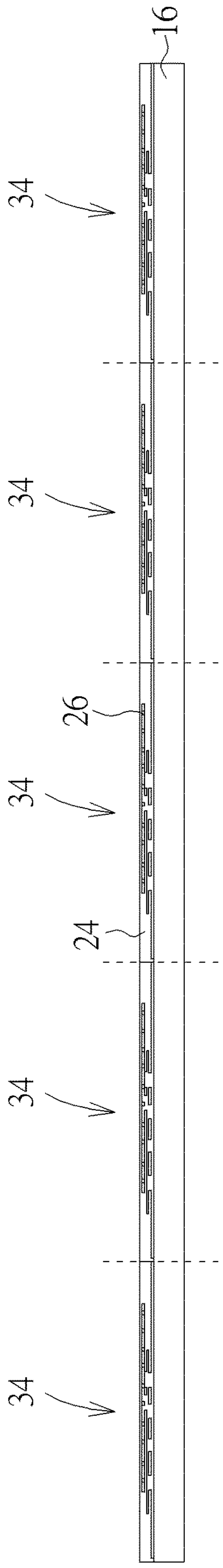

Next, as shown in FIG. 2, a thinning process is conducted to remove part of the substrate 16 of the wafer 14 thereby lowering the overall thickness of the wafer 14, and then a dicing process is conducted to dice the wafer 14 into a plurality of dies or chips 34.

Figure 3:
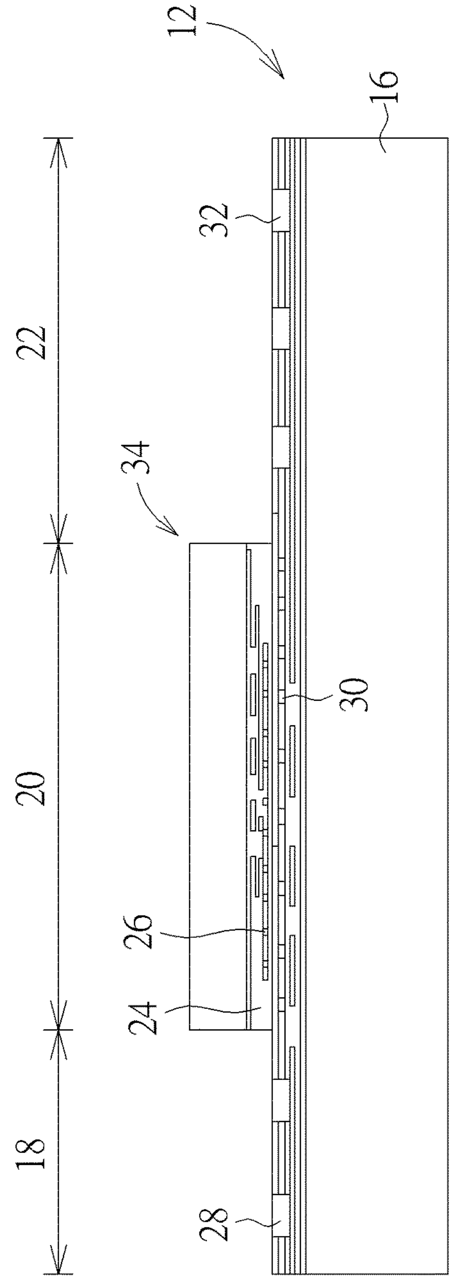

Next, as shown in FIG. 3, the diced chip 34 is reversed and then a bonding process is conducted to bond the chip 34 carrying elements such as LV driving circuits and/or GPUs onto the un-diced wafer 12 carrying MV devices and HV devices. In this embodiment, the metal interconnections 26 on the chip 34 are preferably bonded to the bonding pads 30 on the second area 20 of the wafer 12 through a hybrid bonding approach, in which the metal interconnections 26 on the chip 34 are made of Cu while the bonding pads 30 on the second area 20 are also made of Cu. As such, the two elements 26 and 30 are directly connected or bonded with each other having front side facing front side through a hybrid bonding process.

Figure 4:
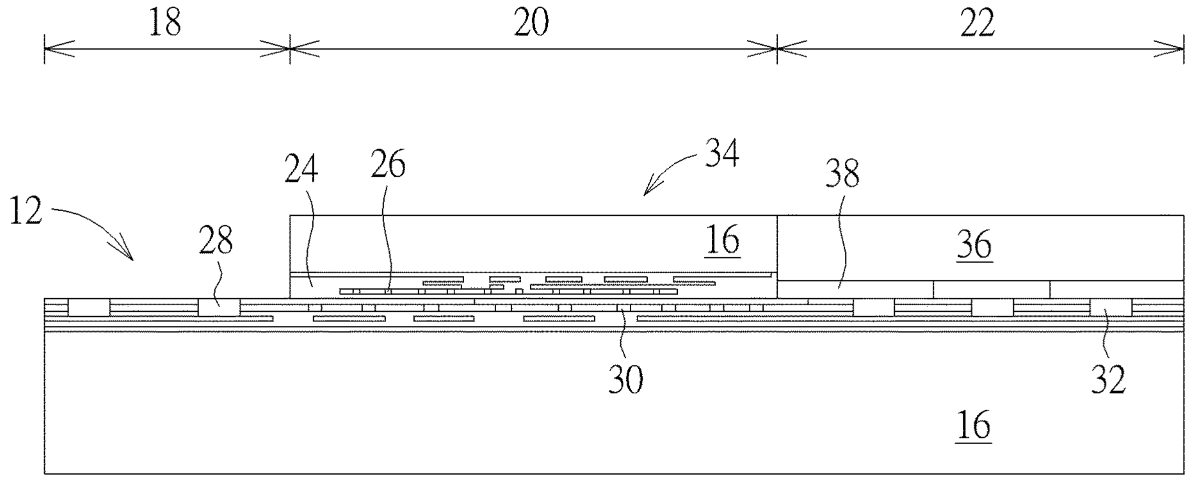

Next, as shown in FIG. 4, a display module fabrication process is conducted to form a micro display 36 connected to the bonding pads 32 on the third area 22. In this embodiment, the micro display 36 could include various display device including but not limited to for example an organic light emitting diode (OLED) display, a mini light emitting diode display, or a micro light emitting diode display depending on the demand of the process or product and each of the micro displays 36 could further include color pixels 38 such as red, green, and blue.

Figure 5:
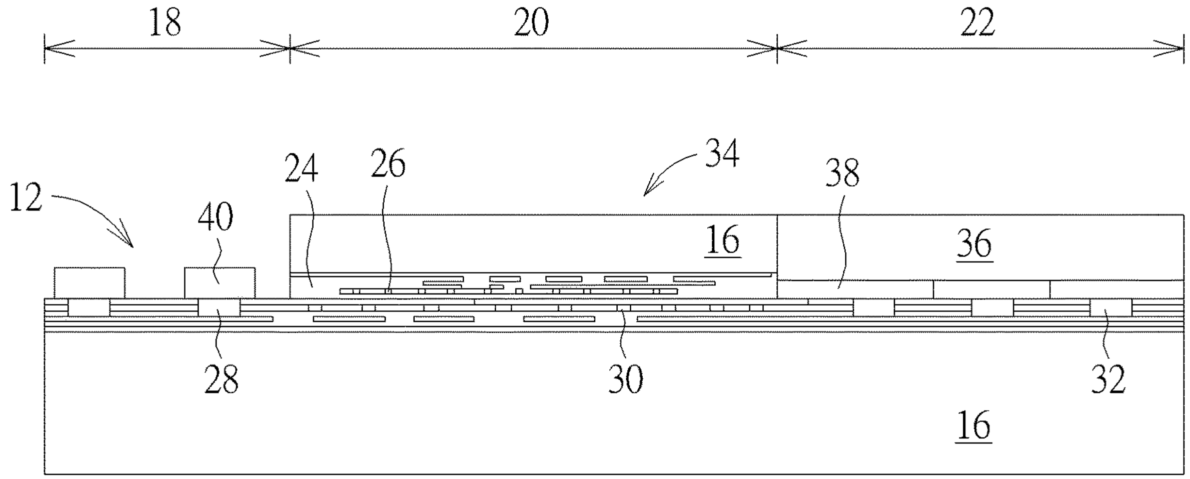

Next, as shown in FIG. 5, conductive wires such as wires 40 are formed to connect to the bonding pads 28 on the first area 18 of the wafer 12, and then the wafer 12 could be diced along the die regions 52 defined in the beginning into desirable dies or chips for later packaging process depending on the demand of the process. In this embodiment, the wires 40 used to connect to external circuits are preferably made of Cu while the bonding pads 28 on the first area 18 are preferably made of low resistance material such as Au. This completes the fabrication of a micro display device according to an embodiment of the present invention.

Figure 6:
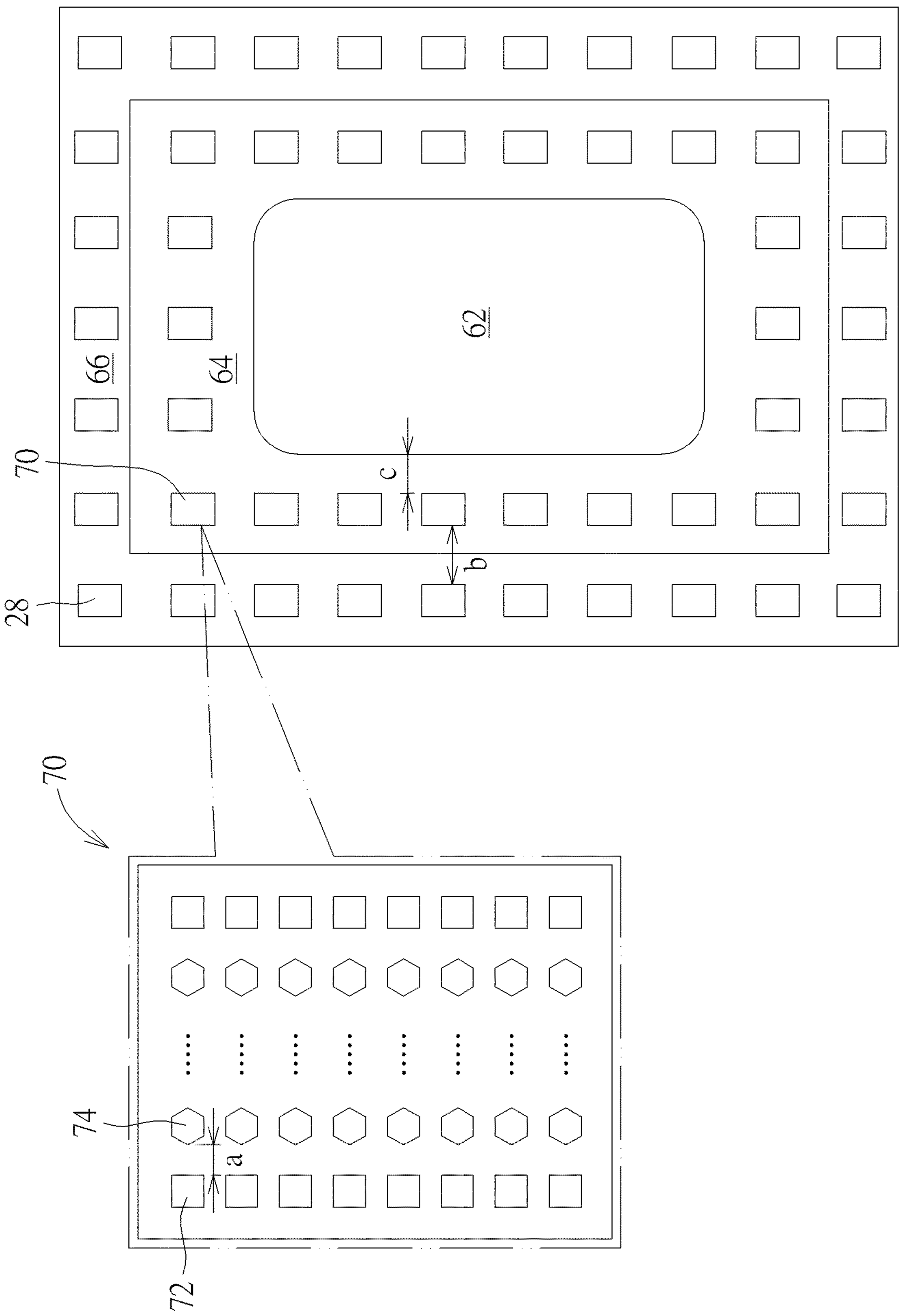
FIG. 6 illustrates a top view of a lower wafer after fabrication of bonding pads is completed according to an embodiment of the present invention.
Figure 7:
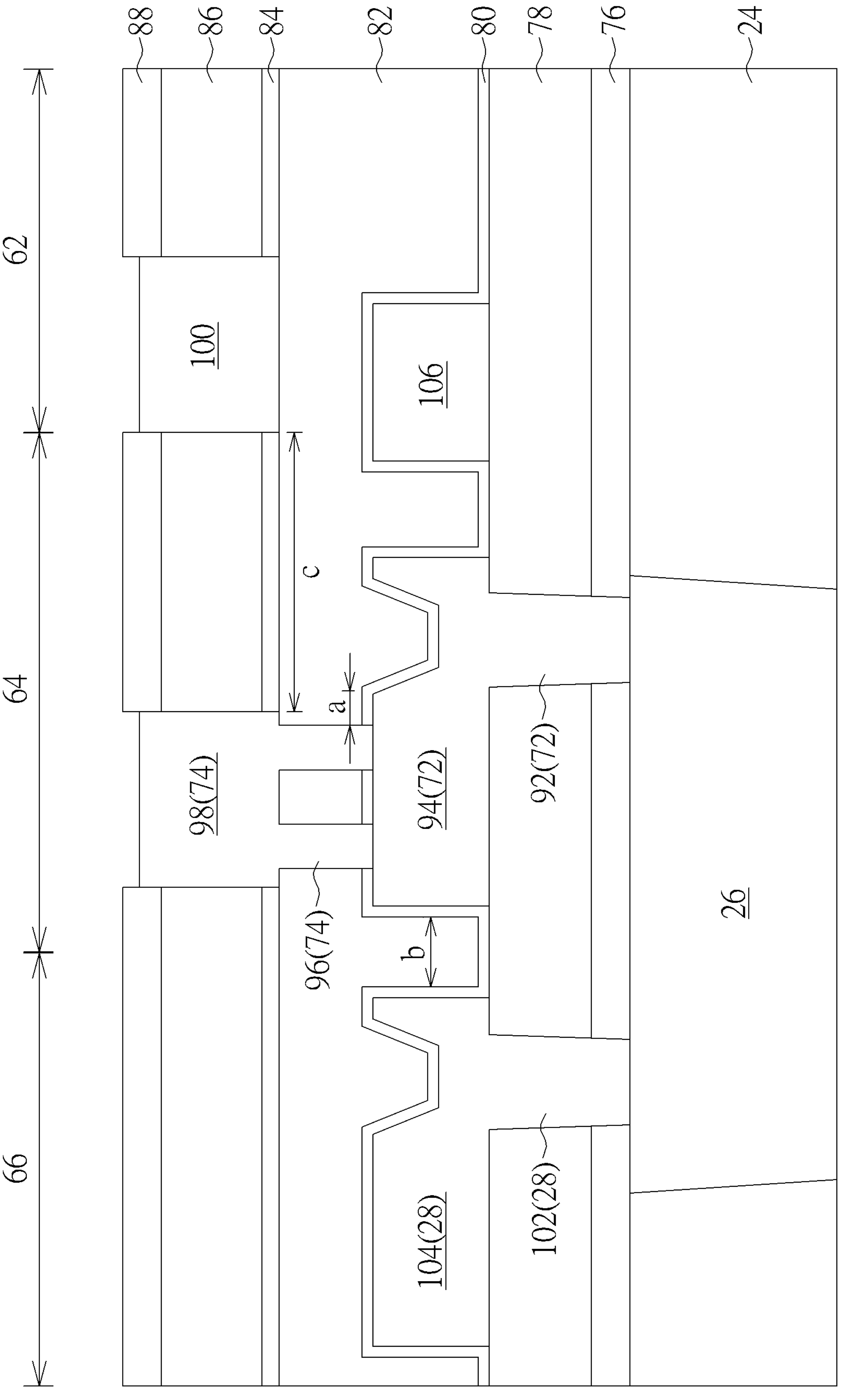
FIG. 7 illustrates a cross-section view of a lower wafer after fabrication of bonding pads is completed according to an embodiment of the present invention.

Referring to FIGS. 6-7, FIGS. 6-7 are top view and cross-section view of the bottom wafer after completing the fabrication of bonding pads according to the aforementioned embodiment, in which the right portion of FIG. 6 illustrates a top view of the overall bottom wafer and the left portion of FIG. 6 illustrates a top view of a sub-bonding area from the bonding area of the right portion. As shown in FIG. 6, the semiconductor device includes a circuit area 62 disposed on the substrate 16 or wafer 12, a bonding area 64 around the circuit area 62, and a pad area 66 or bonding pad area around the bonding area 64. Preferably, a plurality of bonding pads 28 are disposed on the pad area 66 on the right and the bonding area 64 further includes a plurality of sub-bonding areas 70 as each of the sub-bonding areas 70 further includes bonding pads 72 and 74 as shown on the left portion.

Preferably, the pad area 66 is in fact the first area 18 from the aforementioned embodiment and the bonding pads 28 are therefore the bonding pads 28 disposed on the first area 18, the bonding area 64 could be the second area 20 or third area 22 on the die region 52, and the bonding pads 72, 74 could be the bonding pads 30 on the second area 20 or the bonding pads 32 on the third area 22.

Specifically, the plurality of sub-bonding areas 70 are evenly distributed on the bonding area 64 and surrounding the circuit area 62, each of the sub-bonding areas 70 includes a rectangular shape under a top view, each of the sub-bonding areas 70 includes a plurality of bonding pads 72, 74, and the bonding pads 72, 74 are disposed on different levels. Preferably, the bonding pads 72 and the bonding pads 74 have different shapes under a top view perspective, in which each of the bonding pads 72 includes a square while each of the bonding pads 74 includes a hexagon.

In this embodiment, a distance a measured from an edge of the bonding pad 72 to an edge of the bonding pad 74 is preferably between 0-6 microns (μm) or most preferably at 3 microns. A distance b measured from an edge of the sub-bonding area 70 to an edge of the bonding pad 28 is preferably between 0-8 microns (μm) or most preferably at 4 microns, and a distance c between an edge of the sub-bonding area 70 to an edge of the circuit area 62 is preferably between 0-6 microns (μm) or most preferably at 3 microns.

As shown in FIG. 7, it would be desirable to follow the aforementioned processes to form active devices such as MOS transistors on a substrate 16 of the wafer 12, and then form multiple ILD layers or IMD layer 24 on the MOS transistors and metal interconnection 26 in the ILD layer or IMD layer 24 for electrically connecting the MOS transistors. In this embodiment, a plurality of dummy pads such as bonding pad 100 and metal routing 106 are disposed on the circuit area 62, bonding pads 72, 74 are disposed on the bonding area 64, and bonding pad 28 is disposed on the pad area 66, each of the bonding pads 28, 72, 74 are disposed on the active devices and connected to the metal interconnection 26, and upper level IMD layers disposed on the metal interconnection 26 and surrounding the bonding pads 28, 72, 74, 100 could include a stop layer 76, an IMD layer 78, a stop layer 80, an IMD layer 82, a stop layer 84, and IMD layer 86, and a stop layer 88.

Specifically, the metal interconnection 26 is extended from the bonding area 64 to the pad area 66 and the metal interconnection 26 is connected to the bonding pads 72, 74 on the bonding area 64 and the bonding pad 28 on the pad area 66 at the same time, in which the bonding pad 72 includes a bottom portion 92 connected to the metal interconnection 26 and a top portion 94 disposed on the bottom portion 92, the bonding pad 74 includes a bottom portion 96 connected to the top portion 94 of the bonding pad 72 and a top portion 98 disposed on the bottom portion 96, and the bonding pad 28 on the pad area 66 also includes a bottom portion 102 connected to the metal interconnection 26 and a top portion 104 disposed on the bottom portion 102.

Preferably, the top surface of the bottom portion 92 of the bonding pad 72 on the bonding area 64 is even with the top surface of the IMD layer 78 and the top surface of the bottom portion 102 of the bonding pad 28 on the pad area 66, the top surface of the top portion 94 of the bonding pad 72 on the bonding area 64 is even with the top surface of the top portion 104 of the bonding pad 28 on the pad area 66, the top surface of the bottom portion 96 of the bonding pad 74 on the bonding area 64 is even with the top surface of the IMD layer 82, and the top surface of the top portion 98 of the bonding pad 74 on the bonding area 64 is even with top surface of the bonding pad 100 on the circuit area 62. Moreover, the distance a measured from the left sidewall of the bottom portion 92 of the bonding pad 72 on the bonding area 64 to the right sidewall of the bottom portion 96 of the bonding pad 74 atop also shown in FIG. 6 previously is preferably between 0-6 microns or most preferably at 3 microns, the distance b measured between two sidewalls of the stop layer 80 on the bonding area 64 and the pad area 66 or from a left sidewall of the top portion 94 of the bonding pad 72 on the bonding area 64 to a right sidewall of the top portion 104 of the bonding pad 28 on the pad area 66 is between 0-8 microns or most preferably at 4 microns, and the distance c measured from the right sidewall of the top portion 98 of the bonding pad 74 on the bonding area 64 to the left sidewall of the bonding pad 100 on the circuit area 62 is between 0-6 microns or most preferably 3 microns.

Material wise, each of the bonding pads 28, 72, 74, 100 could further includes a barrier layer and a metal layer, in which the barrier layer could be selected from the group consisting of titanium (Ti), titanium nitride (TiN), tantalum (Ta), and tantalum nitride (TaN) and metal layer could be selected from the group consisting of tungsten (W), copper (Cu), aluminum (Al), titanium aluminide (TiAl), and cobalt tungsten phosphide (CoWP), but not limited thereto. In this embodiment, the bonding pads 28, 72 directly contacting the metal interconnection 26 are preferably made of same material such as aluminum (Al) while the bonding pads 74, 100 atop are made of copper (Cu). Nevertheless, according to other embodiment of the present invention the bonding pad 28 could also be made of gold (Au) as disclosed in the aforementioned embodiment. Moreover, the IMD layers 78, 82, 86 are preferably made of silicon oxide or ultra low-k (ULK) dielectric layer and the stop layers 76, 80, 84, 88 are preferably made of nitrogen doped carbide (NDC), silicon nitride, silicon carbon nitride (SiCN), or combination thereof.

Figure 8:
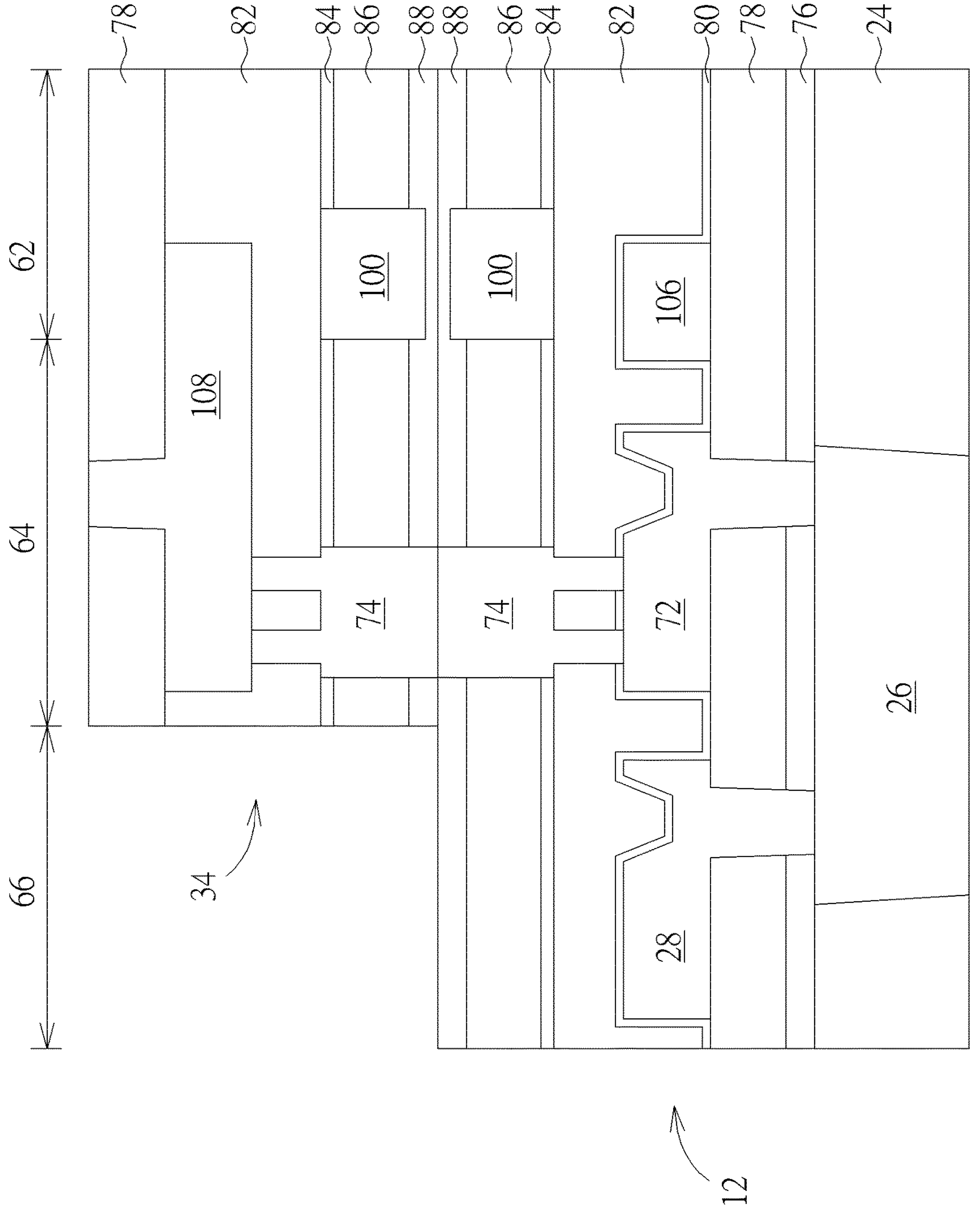
FIG. 8 illustrates an enlarged view of disposing an upper diced chip onto a lower wafer according to an embodiment of the present invention.

Referring to FIG. 8, FIG. 8 illustrates an enlarged view of disposing an upper diced chip 34 onto a lower wafer 12 according to an embodiment of the present invention. For simplicity purpose, elements in the upper chip 34 and the lower wafer 12 are labeled with same numberings from the previous embodiments including the IMD layers 78, 82, 86 and stop layers 84, 88. As shown in FIG. 8, it would be desirable to reverse the upper chip 34 as disclosed in the aforementioned embodiment and then bond the bonding pads 74 on the bonding area 64 of the lower wafer 12 to the bonding pad 74 in the chip 34 through a hybrid bonding process, in which the bonding pad 74 in the wafer 12 and the bonding pad 74 in the chip 34 are made of same material such as copper. In contrast to the bottom surface of the bonding pad 74 in the wafer 12 is connected to a bonding pad 72 made of different material, the bonding pad 74 in the chip 34 is connected to the metal interconnection 108 also made of copper.

Overall, the present invention discloses an approach of using 3DIC stack and packaging approach for fabricating a micro display device. Preferably, it would be desirable to first provide a silicon substrate such as a wafer 12 carrying elements such as MV devices, HV devices, and pixel circuits, in which the wafer 12 could be serving as a carrier substrate for supporting LV devices and micro display modules. Next, a plurality of areas are defined on the wafer including a first area 18 used for connecting to external circuits, a second area 20 used for carrying LV device chips, and a third area 22 used for connecting to a micro display module. Next, external circuits, diced chips carrying LV devices, and micro display module are then bonded to the bonding pads disposed on the three areas 18, 20, 22 respectively. In contrast to conventional system on a chip (SoC) approach for fabricating micro displays, the approach of using 3DIC technique for fabricating micro display devices of the present invention not only reduces overall size and volume of the final product substantially, but also lowers overall cost while maintaining performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:

a substrate comprising a bonding area and a pad area;

a first inter-metal dielectric (IMD) layer on the substrate;

a metal interconnection in the first IMD layer;

a second IMD layer on the first IMD layer;

a first bonding pad on the bonding area and connected to the metal interconnection, and wherein the first bonding pad comprise a first bottom portion connecting the metal interconnection and a first top portion on the first bottom portion, wherein a width of a top surface of the first bottom portion is less than a width of a bottom surface of the first top portion, and wherein a bottom surface of the first top portion directly contacts a top surface of the second IMD layer;

a second bonding pad on the pad area and connected to the metal interconnection; and a third bonding pad on the bonding area and connected to the first bonding pad, wherein the third bonding pad directly contacts the first bonding pad and disposed above the first bonding pad.

2. The semiconductor device of claim 1, wherein the second bonding pad comprises:

a second bottom portion connecting the metal interconnection; and a second top portion on the second bottom portion.

3. The semiconductor device of claim 2, wherein top surfaces of the first top portion and the second top portion are coplanar.

4. The semiconductor device of claim 2, wherein the second IMD layer around the first bottom portion and the second bottom portion, and further comprising:

a third IMD layer on the second IMD layer and around the first top portion and the second top portion.

5. The semiconductor device of claim 4, wherein the third bonding pad comprises:

a third bottom portion connecting the first top portion of the first bonding pad; and a third top portion on the third bottom portion.

6. The semiconductor device of claim 4, wherein the first bonding pad and the third bonding pad comprise different materials.

7. The semiconductor device of claim 1, wherein the first bonding pad and the second bonding pad comprise same material.

8. The semiconductor device of claim 1, wherein the metal interconnection extends from the bonding area to the pad area.

9. A semiconductor device, comprising:

a circuit area defined on a substrate;

a bonding area around the circuit area;

a pad area around the bonding area; and a first bonding pad and a second bonding pad on the bonding area, wherein the first bonding pad and the second bonding pad comprise different shapes in a top view, and wherein the second bonding pad directly contacts the first bonding pad and disposed above the first bonding pad, and wherein the first bonding pad comprise a first bottom portion connecting the metal interconnection and a first top portion on the first bottom portion, wherein a width of a top surface of the first bottom portion is less than a width of a bottom surface of the first top portion, and wherein a bottom surface of the first top portion directly contacts a top surface of a second IMD layer.

10. The semiconductor device of claim 9, further comprising a sub-bonding area on the bonding area, wherein the first bonding pad and the second bonding pad are on the sub-bonding area.

11. The semiconductor device of claim 10, further comprising a third bonding pad on the pad area.

12. The semiconductor device of claim 11, wherein a distance between an edge of the sub-bonding area and an edge of the third bonding pad is between 0-8 microns.

13. The semiconductor device of claim 10, wherein a distance between an edge of the sub-bonding area and the circuit area is between 0-6 microns.

14. The semiconductor device of claim 9, wherein a distance between an edge of the first bonding pad and an edge of the second bonding pad is between 0-6 microns.

15. The semiconductor device of claim 9, wherein the first bonding pad and the second bonding pad are on different levels.

16. The semiconductor device of claim 9, wherein the first bonding pad comprises a square in a top view.

17. The semiconductor device of claim 9, wherein the second bonding pad comprises a hexagon in a top view.

* * * * *